(12) United States Patent
Kim et al.

(10) Patent No.: US 7,459,789 B2
(45) Date of Patent: Dec. 2, 2008

(54) BONDING METHOD OF FLEXIBLE FILM AND DISPLAY BONDED THEREBY

(75) Inventors: Yun-Hee Kim, Hawseong-si (KR); Won-Gu Cho, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 333 days.

(21) Appl. No.: 11/173,759

(22) Filed: Jun. 30, 2005

(65) Prior Publication Data

US 2005/0241758 A1    Nov. 3, 2005

(30) Foreign Application Priority Data

Jul. 1, 2004    (KR) ...................... 10-2004-0051151

(51) Int. Cl.
*H01L 23/52*    (2006.01)
*H01L 23/48*    (2006.01)
*H01L 23/40*    (2006.01)
*H01L 23/492*   (2006.01)
*H01L 23/49*    (2006.01)
*G02F 1/1345*   (2006.01)

(52) U.S. Cl. .................. 257/773; 257/736; 257/786; 257/E23.027; 257/E23.025; 349/149

(58) Field of Classification Search ................. 257/773, 257/736, 786, E23.027, E23.025; 349/149
See application file for complete search history.

(56) References Cited

U.S. PATENT DOCUMENTS

| | | | | |
|---|---|---|---|---|
| 5,317,438 | A | * | 5/1994 | Suzuki et al. ............... 349/192 |
| 5,528,403 | A | * | 6/1996 | Kawaguchi et al. ......... 349/149 |
| 5,914,763 | A | * | 6/1999 | Fujii et al. .................. 349/149 |
| 6,086,441 | A | * | 7/2000 | Akiguchi et al. .............. 445/24 |
| 6,172,730 | B1 | * | 1/2001 | Fujita ......................... 349/149 |
| 6,211,936 | B1 | | 4/2001 | Nakamura |
| 6,414,741 | B2 | * | 7/2002 | Hasegawa et al. ........... 349/187 |
| 6,806,936 | B2 | * | 10/2004 | Nakaminami et al. ....... 349/149 |

FOREIGN PATENT DOCUMENTS

| | | |
|---|---|---|
| JP | 02-301725 | 12/1990 |
| JP | 11-249163 | 9/1999 |
| JP | 11-288002 | 10/1999 |
| JP | 2001-042353 | 2/2001 |
| JP | 2001-223445 | 8/2001 |
| JP | 2001-331122 | 11/2001 |
| JP | 2002-299773 | 10/2002 |
| JP | 2002-358026 | 12/2002 |
| KR | 10-0326836 | 2/2002 |
| KR | 100332439 | 4/2002 |
| KR | 100374960 | 2/2003 |
| KR | 1020030035888 | 5/2003 |

* cited by examiner

*Primary Examiner*—Luan Thai
(74) *Attorney, Agent, or Firm*—Edward C. Kwok; MacPherson Kwok Chen & Heid LLP (57) ABSTRACT

A bonding method of a flexible film is provided, which includes: positioning an anisotropic conductive film on a plurality of first signal lines formed on the flexible film to be bonded to a thin film transistor (TFT) panel; arranging the anisotropic conductive film on the TFT panel to align the first signal lines formed on the flexible film and a plurality of second signal lines formed on the TFT panel; positioning at least one portion of a protection film for protecting the second signal lines of the flexible film to be overlapped with the TFT panel; and pressing the flexible film and the TFT panel.

8 Claims, 6 Drawing Sheets

BONDING METHOD OF FLEXIBLE FILM AND DISPLAY BONDED THEREBY

This application relies for priority upon Korean Patent Application No. 2004-0051151 filed on Jul. 1, 2004, the contents of which are herein incorporated by reference in its entirety.

BACKGROUND OF THE INVENTION (a) Field of the Invention

The present invention relates to a bonding method for a flexible film and a display device having a flexible film bonded by the bonding method.

(b) Description of Related Art

A liquid crystal display (LCD) includes (a) a lower panel having gate lines, data lines, switching elements, such as thin film transistors (TFTs), and pixel electrodes; (b) an upper panel facing the lower panel and having color filters and a common electrode; and (c) a liquid crystal (LC) layer interposed between the upper panel and the lower panel.

The switching elements, which receive both gate signals and data signals on the gate lines and the data lines, are activated by gate signals transmitted through the gate lines. The switching elements supply data voltages transmitted through the data lines to the pixel electrodes.

The gate lines are supplied with gate signals from a gate driver, and the data lines are supplied with data voltages from a data driver. The gate and data drivers include a plurality of integrated circuit (IC) chips which may be provided according to various types of assembly. The assembly is connected to the lower panel. In one type of assembly, the IC chips are mounted on the lower panel, and in another type of assembly, the IC chips are mounted on at least one flexible film. The former is called a COG (chip on glass) or a FOG (film on glass) assembly, and the latter is called a TCP (tape carrier package) assembly.

In the COG or FOG type assembly, the IC chips and the flexible film are directly mounted on the lower panel. The flexible film is called an FPC (flexible printed circuit), and it includes a flexible body, a plurality of signal lines formed on the body, and a protection film formed on the signal lines. The protection film for the FPC is formed with a cover layer, but it may be formed with a solder resist.

In the TCP type assembly, the IC chips are mounted on at least one flexible film attached to the lower panel. Under TCP type assembly, the assembly may be further classified into a TAB (tape automated bonding) type assembly or a COF (chip on film) type assembly. The TCP type assembly includes a flexible body, a plurality of signal lines formed on the body, a protection film formed on the signal lines, and IC chips mounted on the protection film. In this assembly type, the protection film is formed with a solder resist. The primary difference between flexible films of the TCP type assembly and flexible films of the COG or FOG type assembly is the mounting position of the IC chips.

A plurality of signals are generated at a controller mounted on a separate PCB (printed circuit board) and transmitted to the IC chips through the flexible film. The flexible film is attached to the lower panel using an anisotropic conductive film (ACF), which contains conductive particles that electrically connect the signal lines formed on the flexible film and the signal lines formed on the lower panel to each other.

However, when the flexible film is attached to the lower panel, a disconnection of the signal lines caused by external stress can occur at the bonding portions of the signal lines, which are not covered with a protection film.

SUMMARY OF THE INVENTION

In an embodiment of the present invention, a bonding method for a flexible film is provided, which includes positioning an anisotropic conductive film on a plurality of first signal lines formed on the flexible film to be bonded to a thin film transistor (TFT) panel, aligning the anisotropic conductive film on the TFT panel, such that the first signal lines formed on the flexible film are aligned with a plurality of second signal lines formed on the TFT panel, positioning a portion of a protection film on the flexible film to overlap with a portion of the TFT panel, the protection film protecting the first signal lines of the flexible film, and pressing the flexible film and the TFT panel, such that the flexible film and the TFT panels are in contact along the overlapping portions of the protection film and the TFT panel.

The anisotropic conductive film may overlap at least one portion of a flexible body of the flexible film.

The method may further include forming a cover layer on a surface of the protection film which is not attached to the anisotropic conductive film.

The cover layer may be formed on a portion of the TFT panel.

The protection film adjacent to the anisotropic conductive film may have an end with an uneven shape.

Dummy lines without signal transmission capabilities may be formed beside the first signal lines.

The dummy lines may be the outermost lines with respect to the first signal lines.

The dummy lines may have widths wider than widths of the first remaining signal lines.

The number of the dummy lines may be two or more.

In a further embodiment of the present invention, a bonding method of a flexible film is provided, which includes positioning an anisotropic conductive film on a plurality of first signal lines formed on a thin film transistor (TFT) panel, positioning the flexible film on the anisotropic conductive film to align the first signal lines formed on the TFT panel with a plurality of second signal lines formed on the flexible film, positioning at least one portion of a protection film for protecting the second signal lines of the flexible film to be overlapped with the TFT panel, and pressing the flexible film and the TFT panel such that the flexible film and TFT panel are in contact along the overlapping portion of the protection film and the TFT panel.

The anisotropic conductive film may overlap at least one portion of a flexible body of the flexible film.

The method may further include forming a cover layer on a surface of the protection film which is not attached to the anisotropic conductive film.

The cover layer may be formed on a portion of the TFT panel.

The protection film adjacent to the anisotropic conductive film may have an end with an uneven shape.

Dummy lines without signal transmission capabilities may be formed beside the second signal lines.

The dummy lines may be the outermost lines with respect to the second signal lines.

The dummy lines may have widths wider than widths of the second remaining signal lines.

The number of the dummy lines may be two or more.

In a still further embodiment of the present invention, a display device is provided, which includes a thin film transistor panel including a plurality of first signal lines, a flexible film including a second plurality of second signal lines and a protection film for protecting the second signal lines, and an anisotropic conductive film connecting the first signal lines with the second signal lines wherein the protection film exposes a portion of the first signal lines, the exposed first signal lines and the second signal lines are aligned to match each other, and a portion of the protection film is overlapped with the TFT panel.

The anisotropic conductive film may overlap at least one portion of a flexible body of the flexible film.

The method may further include forming a cover layer on a surface of the flexible film which is not attached to the anisotropic conductive film.

The cover layer may be formed on a portion of the TFT panel.

The protection film adjacent to the anisotropic conductive film may have an end with an uneven shape.

Dummy lines without signal transmission capabilities may be formed beside the second signal lines.

The dummy lines may be the outermost lines with respect to the second signal lines.

The dummy lines may have widths wider than widths of the second remaining signal lines.

The number of the dummy lines may be two or more.

BRIEF DESCRIPTION OF THE DRAWINGS

The present invention will become more apparent by describing preferred embodiments thereof in detail with reference to the accompanying drawings, in which.

DETAILED DESCRIPTION OF EMBODIMENTS

The present invention now will be described more fully hereinafter with reference to the accompanying drawings, in which preferred embodiments of the inventions invention are shown. This invention may, however, be embodied in many different forms and should not be construed as limited to the embodiments set forth herein.

In the drawings, the thickness of layers and regions are exaggerated for clarity. Like numerals refer to like elements throughout. It will be understood that when an element such as a layer, film, region, substrate, or panel is referred to as being "on" another element, it can be directly on the other element or intervening elements may also be present. In contrast, when an element is referred to as being "directly on" another element, there are no intervening elements present.

Bonding methods of a flexible film and display devices bonded with the bonding method according to embodiments of the present invention will be now described with reference to the drawings.

Figure 1:
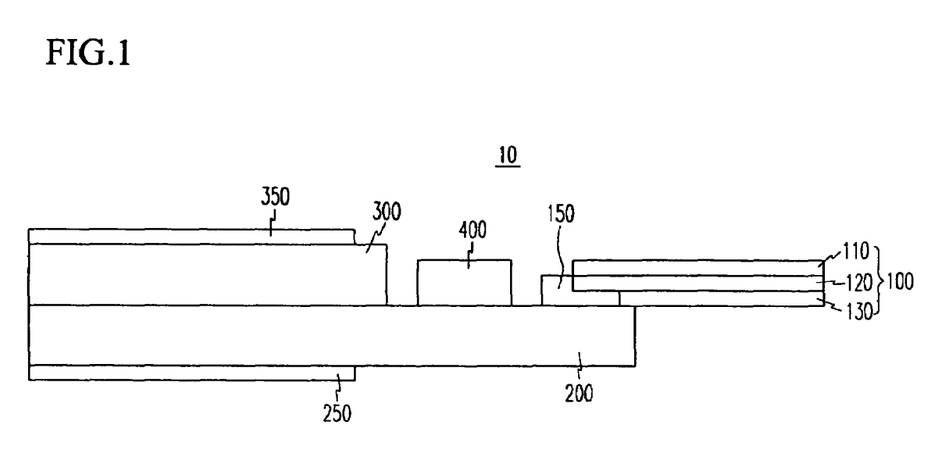
FIG. 1 is schematic diagram of an LCD with a flexible film attached thereto according to an embodiment of the present invention.

FIG. 1 is schematic diagram of an LCD with a flexible film attached thereto according to an embodiment of the present invention.

An LCD 10 according to the embodiment of the present invention includes a lower panel 200, an upper panel 300, a liquid crystal (LC) layer (not shown) interposed between lower panel 200 and upper panel 300, a plurality of driving chips 400, at least one flexible film 100, and at least one anisotropic conductive film 150.

The lower panel 200 includes a plurality of signal lines such as gate lines and data lines, a plurality of thin film transistors (TFTs), and a plurality of pixel electrodes. Lower panel 200, including the signal lines, TFTs and panel electrodes, is referred to herein as a TFT panel. The upper panel 300 includes a plurality of color filters and a common electrode.

Lower and upper polarizers 250 and 350 are attached to the outer surfaces of the lower and upper panels 200 and 300, respectively.

The flexible film 100 includes a flexible body 110, a plurality of metallic signal lines 120 formed on flexible body 110, and a protection film 130.

As shown in FIG. 1, the signal lines 120 are formed to the ends of the flexible body 110, and the protection film 130 is formed adjacent to the signal lines 120, except near one end of signal lines 120, to enable the signal lines 120 to be connected to a plurality of signal lines formed on the lower panel 200 through exposed portions of the signal lines 120. The protection film 130 is formed with a cover layer, but it may be formed with a solder resist.

As shown in FIG. 1, the lower panel 200 is electrically and mechanically connected to the flexible film 100 through the anisotropic conductive film 150. In addition, a portion of the protection film 130 overlaps the lower panel 200. The conductive film 150 is formed adjacent to the end of the overlapping portion of the protection film 130 without a gap between conductive film 150 and protective film 130, to protect lower panel 200 from contamination, such as from dust.

Next, an assembly processes of the above-described LCD will be described with reference to FIGS. 2 and 3.

Figure 2:
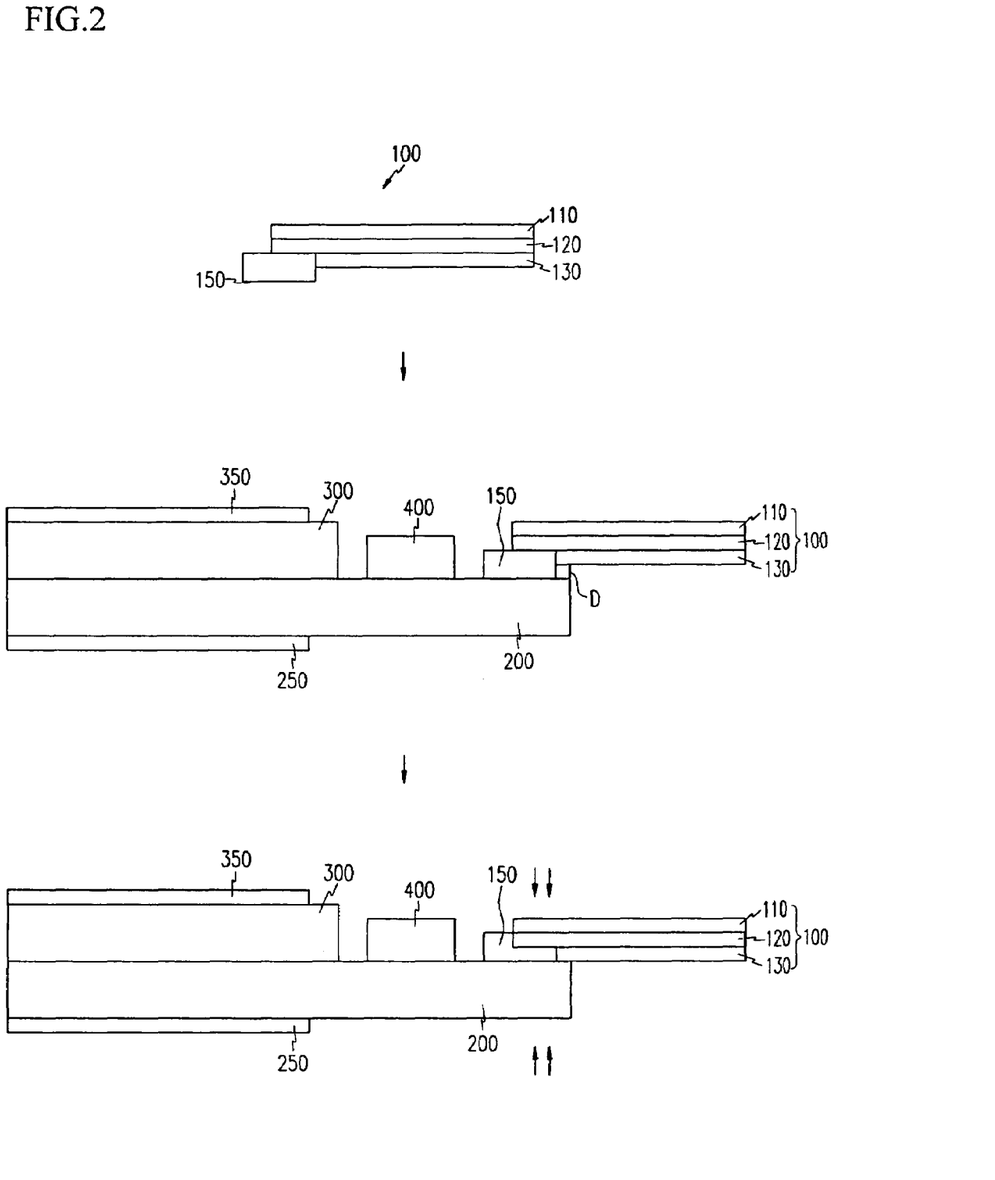
FIG. 2 illustrates an assembly process of the LCD shown in FIG. 1.
Figure 3:
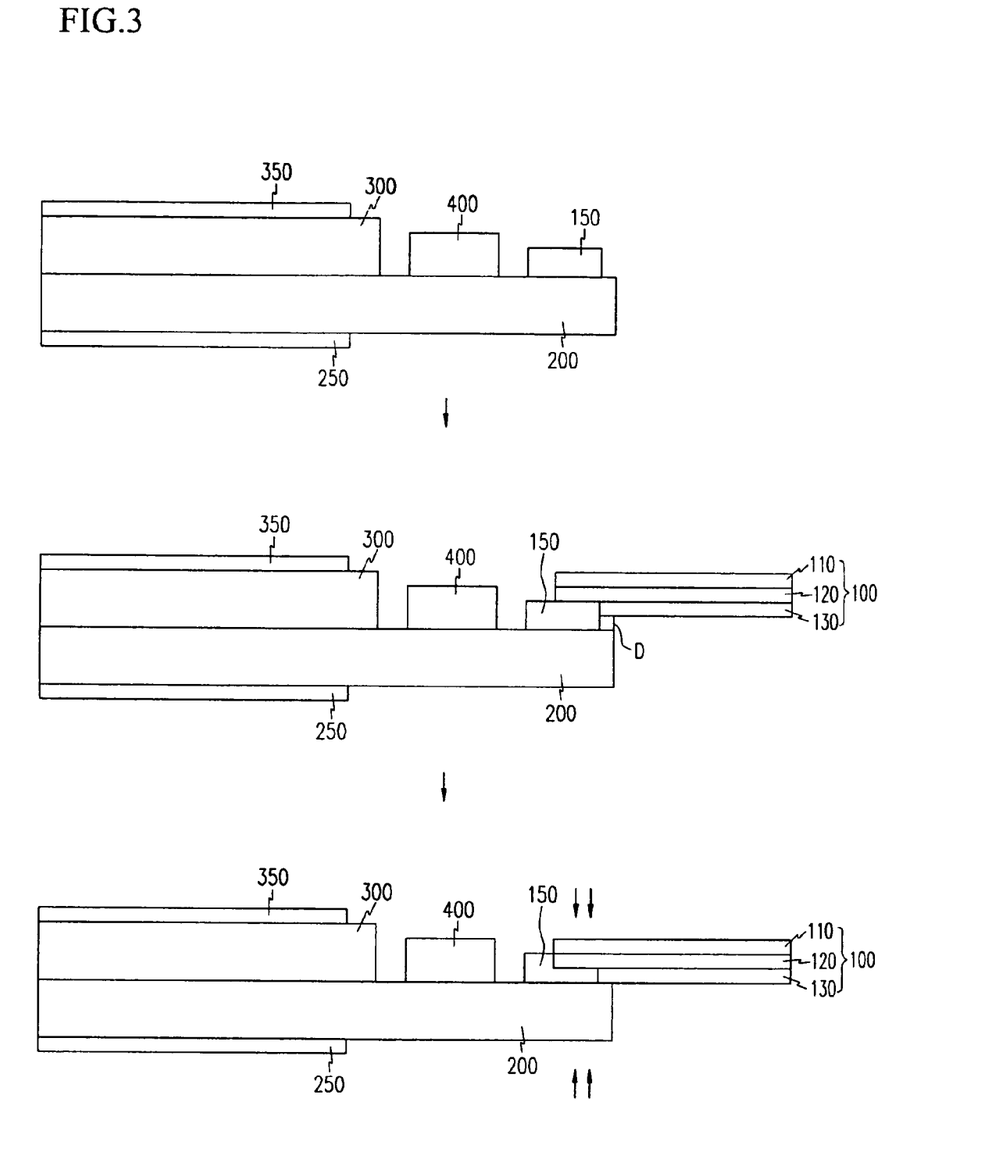
FIG. 3 illustrates another assembly process of the LCD shown in FIG. 1.

FIG. 2 illustrates an assembly process of the LCD shown in FIG. 1, and FIG. 3 illustrates another assembly process of the LCD shown in FIG. 1.

First, referring to FIG. 2, an assembly process of the LCD will be described in detail.

The conductive film 150 is applied to a connection portion of the signal lines 120 which are exposed, ready to be connected to the lower panel 200.

Next, the conductive film 150 is arranged such that the signal lines 120 of the flexible film 100 overlap signal lines (not shown) of the lower panel 200. At this time, a predetermined portion of the protection film 130 overlaps the lower panel 200, but is apart from the lower panel 200 by a distance D.

By pressing, the flexible film 100 is mechanically connected to the lower panel 200,—i.e., eliminating the distance D—through the anisotropic conductive film 150 having a plasticity. Signal lines 120 are electrically connected to the lower panel 200 by conductive particles which are contained in the conductive film 150.

When the flexible film 100 is connected to the lower panel 200 through the conductive film 150 by the process shown in FIG. 2 and as described above, alignment errors due to the conductive film 150 plastically flowing down along one side wall of the lower panel 200 while attaching the flexible film 100 to the lower panel 200 decreases; so that the exposure of the signal lines formed on the lower panel 200 is reduced.

Since a predetermined portion of the protective film 130 overlaps the lower panel 200, crack generation at a point of connection between the lower panel 200 and the protective film 130 is prevented.

In addition, by overlapping the protection film 130 on the lower panel 200, cracks in the signal lines which can be generated at an edge of the lower panel 200 due to stress generated by the bending of the flexible film 100 are reduced.

Next, referring to FIG. 3, another assembly process of the above-described LCD will be described in detail. In this process, unlike in FIG. 2, an anisotropic conductive film 150 is directly mounted on a lower panel 200, to allow connecting signal lines 120 of a flexible film 100 to the lower panel 200.

The above-described connection will now be described in detail.

First, the anisotropic conductive film 150 is applied to an upper portion of the lower panel 200, which is to be connected to the flexible film 100.

Next, the flexible film 100 is aligned on the conductive film 150 such that the signal lines 120 of the flexible film 100 overlap signal lines (not shown) of the lower panel 200. At this time, a predetermined portion of the protection film 130 overlaps the lower panel 200, but is apart from the lower panel 200 by a distance D.

By pressing, the flexible film 100 is mechanically connected to the lower panel 200—i.e., elimininating the distance D—through the anisotropic conductive film 150 having a plasticity. The signal lines 120 are electrically connected to the lower panel 200 by conductive particles which are contained in the conductive film 150.

Since a predetermined portion of the protective film 130 overlaps the lower panel 200, crack generation at a point of connection between the lower panel 200 and the protective film 130 is prevented. In addition, by overlapping the protection film 130 on the lower panel 200, cracks of signal lines, which can be generated at an edge of the lower panel 200 due to stress generated by the bending of the flexible film 100 are also reduced.

Next, an LCD according to another embodiment of the present invention will be described with reference to FIG. 4.

Figure 4:
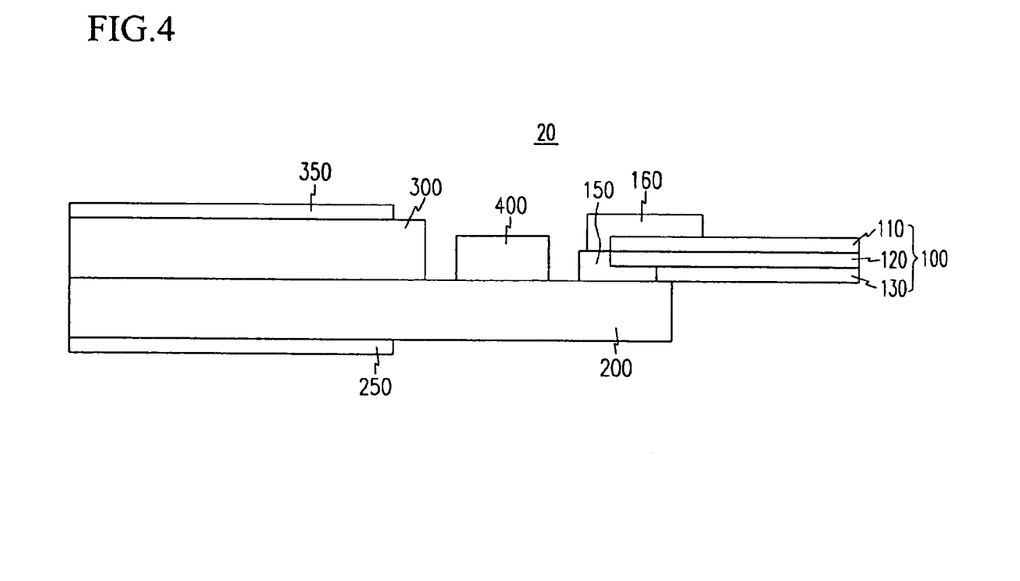
FIG. 4 is schematic diagram of an LCD with a flexible film attached thereto according to another embodiment of the present invention.

FIG. 4 is schematic diagram of an LCD with a flexible film attached, according to another embodiment of the present invention.

An LCD 20 according to another embodiment of the present invention has the same construction as that of FIG. 1, except it further includes a cover layer 160 over the anisotropic conductive film 150. Thus, the elements performing the same operations are indicated in FIG. 4 with the same reference numerals, and a repetitive detailed description of elements already described is omitted.

As shown in FIG. 4, the cover layer 160 is formed on upper surfaces of the flexible film 100 and the anisotropic conductive film 150. Thus, stress due to bending of the flexible film 100 is dispersed toward an end of the cover layer 160, and thereby dispersing the stress applied to the signal lines 120 at the edge of the lower panel 200. As a result, the signal lines 120 are protected from cracks.

The flexible film 100 described above with reference to FIGS. 1 and 4 can be applied to both the TCP type as well as the COG/FOG type.

Figure 6:
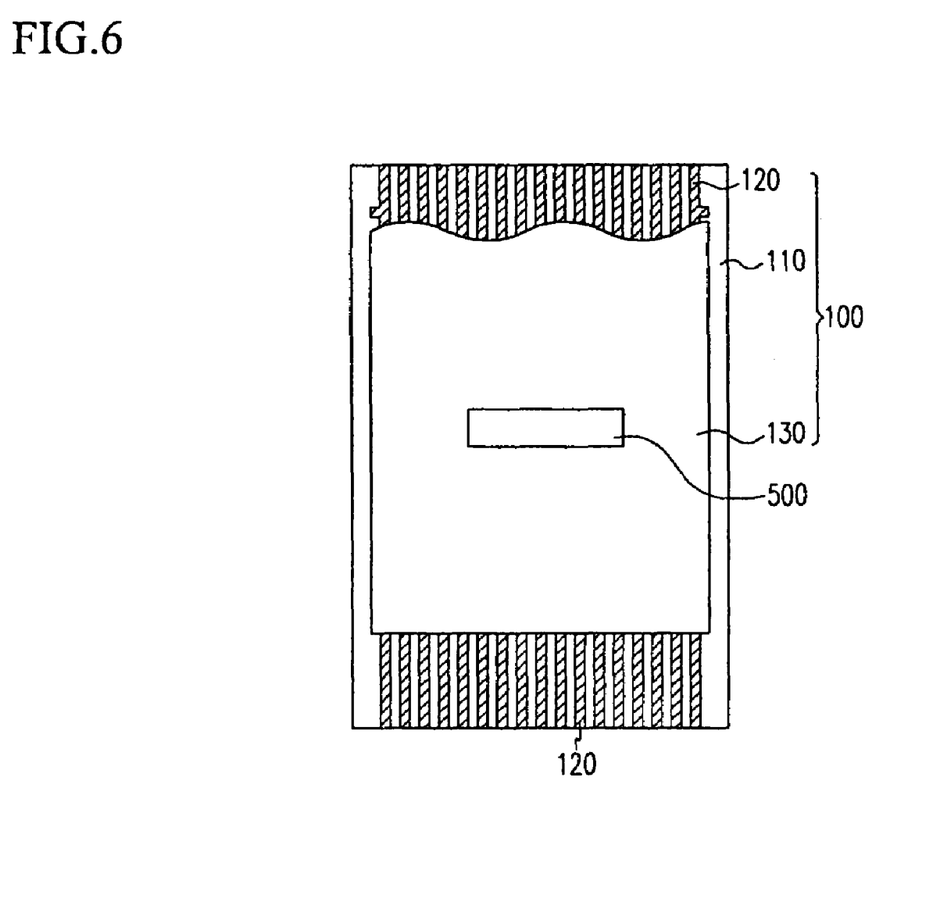
FIG. 6 is a plan diagram of another example of the flexible film according to the embodiments of the present invention.
Figure 7:
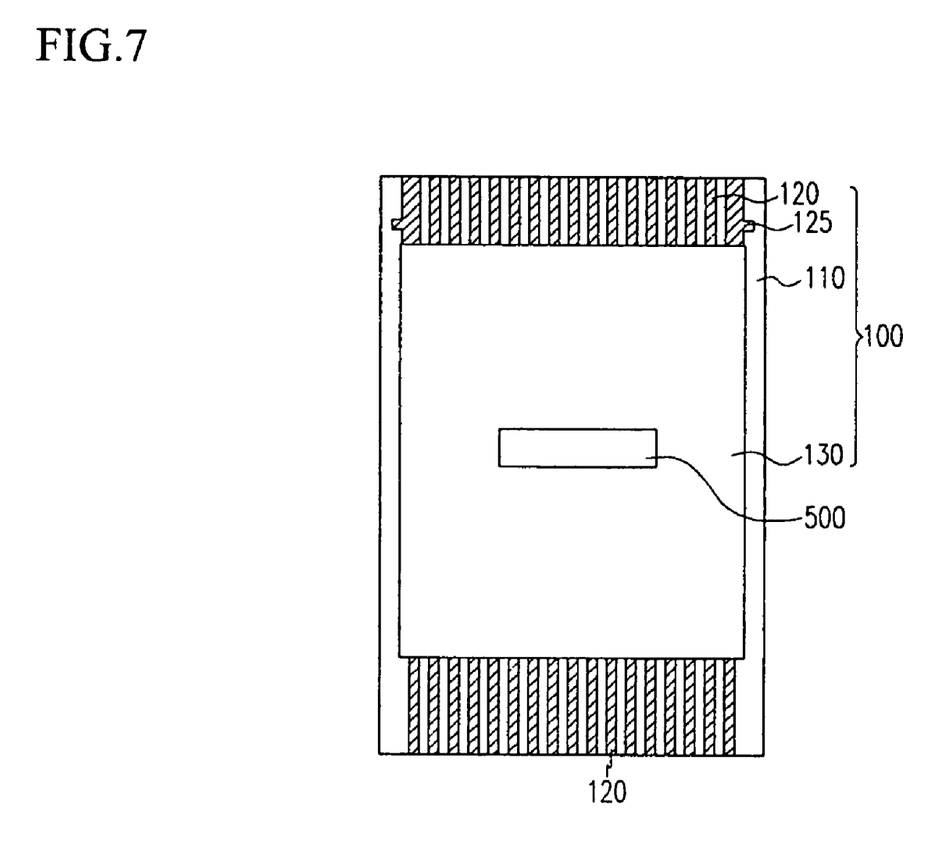
FIG. 7 is a plan diagram of another example of the flexible film according to the embodiments of the present invention.

Next, flexible films according to further embodiments of the present invention will be described with reference to FIGS. 5 to 7, which are plan diagrams of examples of the flexible film according to further embodiments of the present invention. The flexible films shown in FIGS. 5 to 7 are for the TCP type assembly, but they may also be applied to the COG or FOG type assembly.

Figure 5:
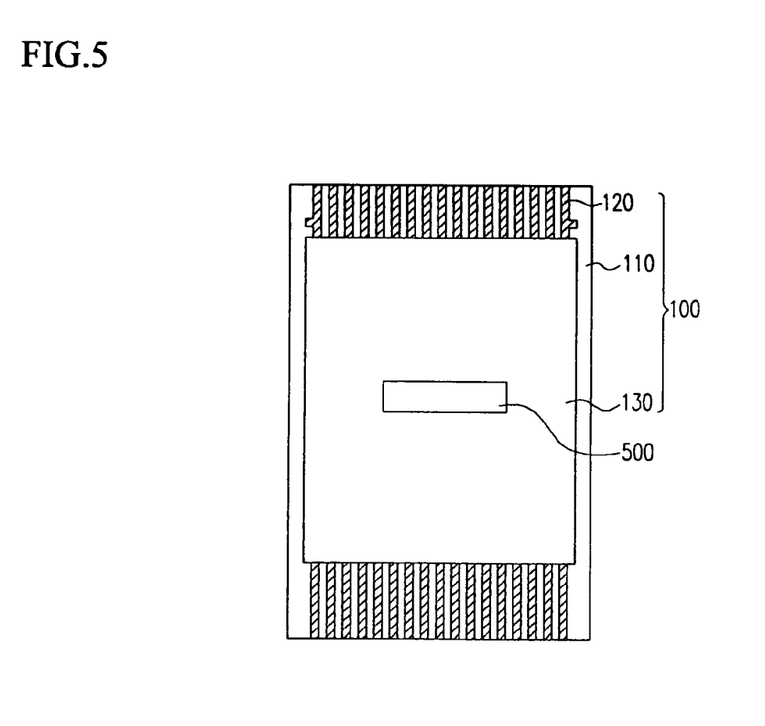
FIG. 5 is a plan diagram of an example of the flexible film according to the embodiments of the present invention.

First, referring to FIG. 5, a plurality of signal lines 120 are formed on a flexible body 110 of a flexible film 100. The signal lines 120 are formed with conductive materials such as a metal, and are formed from an upper end of the body 110 to a lower end thereof. The upper part of the body 110 is a portion for connecting to a lower panel (not shown). When connecting the flexible film 100 and the lower panel to each other, an upper surface of the flexible film 100 is connected to an upper surface of the lower panel.

A protection film 130 is formed on a predetermined portion of the signal lines 120 at the middle of the flexible body 110. In this embodiment, the flexible film 100 is for a TCP type assembly and the protection film 130 is a solder resist. In addition, a driving chip 500 is mounted on the protection film 130.

Align marks are formed at the signal lines which are positioned at both outermost portions thereof, such that a connection position when connecting the flexible film 100 to a lower panel (not shown) is clear.

FIG. 6 is another example of the flexible film modified with respect to the flexible film 100 of FIG. 5. As shown in FIG. 6, a protection film 130 of solder resist has a connection portion of an uneven shape, which is connected to a lower panel (not shown). Because of the connection portion of an uneven shape, stress applied toward the connection portion is effectively dispersed.

FIG. 7 is another example of the flexile film. As shown in FIG. 7, a flexible film 100 includes dummy lines 125 as well as a plurality of signal lines 120. The dummy lines 125 are formed with conductive materials such as a metal and do not transmit signals, unlike the signal lines 120.

When the flexible film 100 is connected to the lower panel and bent downward, the two outermost positioned signal lines bear the most stress. However, by forming the dummy lines 125 at both outermost positions, the stress is dispersed to the dummy lines 125 and even if the dummy lines 125 are disconnected by the stress, signal transmission is normal through the signal lines 120. There may be one or more dummy lines 125, depending on the desired design. As the number of dummy lines 125 becomes larger, the efficiency of dispersion of the stress applied from outside increases. In addition, rather than increasing the number of dummy lines 125, the dummy lines 125 may have widths wider than those of the signal lines 120 to increase the efficiency of stress dispersion. In FIG. 7, for example, the dummy lines 125 have widths wider than those of the signal lines 120.

The present invention decreases a probability of signal line disconnection, and protect against dust Additionally, alignmnet error due to the conductive film flowing down along one side wall of the lower panel while attaching the flexible film to the lower panel is reduced.

While the present invention has been described in detail with reference to the preferred embodiments, it is to be understood that the invention is not limited to the disclosed embodiments, but on the contrary, is intended to cover various modifications and equivalent arrangements included within the sprit and scope of the appended claims.

What is claimed is:

1. A display device comprising:
   a thin film transistor (TFT) panel including a plurality of first signal lines;
   a flexible film including a plurality of second signal lines and a protection film protecting the second signal lines; and
   an anisotropic conductive film connecting the first signal lines and the second signal lines, wherein the protection film exposes a portion of the second signal lines, the first signal lines and the exposed second signal lines are aligned to match each other, and a portion of the protection film overlaps the TFT panel, and a portion of the protection film adjacent the anisotropic conductive film has an end with an uneven shape of a constant thickness.

2. The device of claim 1, wherein the anisotropic conductive film overlaps at least one portion of a flexible body of the flexible film.

3. The device of claim 1, further comprising forming a cover layer on a surface of the flexible film which is not attached to the anisotropic conductive film.

4. The device of claim 3, wherein the cover layer is formed on a portion of the TFT panel.

5. The method of claim 1, wherein dummy lines without signal transmission capabilities are formed beside the second signal lines.

6. The device of claim 5, wherein the dummy lines are the outermost lines with respect to the second signal lines.

7. The device of claim 5, wherein the dummy lines have widths wider than widths of the second signal lines.

8. The device of claim 5, wherein the number of dummy lines is two or more.

* * * * *